United States Patent
Giunta et al.

(10) Patent No.: US 11,549,998 B1
(45) Date of Patent: Jan. 10, 2023

(54) DRIVER DEVICE HAVING AN NMOS POWER TRANSISTOR AND A BLOCKING CIRCUIT FOR STRESS TEST MODE, AND METHOD OF STRESS TESTING THE DRIVER DEVICE

(71) Applicant: Infineon Technologies AG, Neubiberg (DE)

(72) Inventors: Carmelo Giunta, Munich (DE); Marcus Nuebling, Olching-Esting (DE); Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/377,486

(22) Filed: Jul. 16, 2021

(51) Int. Cl.
*G01R 31/52* (2020.01)
*G01R 31/26* (2020.01)
*H03K 17/687* (2006.01)

(52) U.S. Cl.
CPC ......... *G01R 31/52* (2020.01); *G01R 31/2621* (2013.01); *H03K 17/6872* (2013.01)

(58) Field of Classification Search
CPC ................ G01R 31/52; G01R 31/2621; H03K 17/6872
USPC ....................... 324/762.09, 762.01, 537, 500
See application file for complete search history.

(56) References Cited

U.S. PATENT DOCUMENTS

| | | | |
|---|---|---|---|
| 11,196,273 B2* | 12/2021 | Jeong | G01R 19/165 |
| 2022/0139325 A1* | 5/2022 | Lee | G06F 3/147 |
| | | | 345/694 |
| 2022/0223087 A1* | 7/2022 | Huang | G09G 3/20 |

* cited by examiner

*Primary Examiner* — Giovanni Astacio-Oquendo
(74) *Attorney, Agent, or Firm* — Murphy, Bilak & Homiller, PLLC

(57) ABSTRACT

A driver device includes: a voltage terminal; a ground terminal; an output terminal; a first nMOS power transistor having a drain electrically connected to the voltage terminal, a source electrically connected to the output terminal, and a gate; an overvoltage protection circuit configured to limit a gate-to-source voltage of the first nMOS power transistor in a normal operating mode for the driver device; a pulldown circuit configured to force the first nMOS power transistor off in a stress test mode for the driver device; and a blocking circuit configured to block current flow from the output terminal to the ground terminal through the overvoltage protection circuit and the pulldown circuit in the stress test mode. A method of stress testing the driver device is also described.

22 Claims, 4 Drawing Sheets

DRIVER DEVICE HAVING AN NMOS POWER TRANSISTOR AND A BLOCKING CIRCUIT FOR STRESS TEST MODE, AND METHOD OF STRESS TESTING THE DRIVER DEVICE

BACKGROUND

Semiconductor devices sometimes have latent defects that are present and capable of emerging or developing over time but are not active at the time of initial production and testing. A semiconductor device with one or more latent defects is prone to dysfunction or even failure before the end of the specified lifetime for the device. To avoid dysfunction and failure over the specified lifetime of semiconductor devices, latent defects should be activated before the devices enter the field of use.

One approach for activating latent defects in semiconductor devices is stress testing whereby the gate-to-source voltage of a transistor is forced to a positive or negative value that exceeds the maximum rated gate-to-source voltage for the transistor. A high-side nMOS power transistor of a typical driver device has high current capability and therefore is a large device, making the high-side nMOS power transistor more likely to contain a latent defect. High-side nMOS power transistors are conventionally stressed by forcing the gate of the high-side nMOS power transistor to a voltage higher than the maximum rated voltage, via a dedicated pad of the semiconductor die (chip) that includes the high-side nMOS power transistor. However, this approach affects the die area in an additional, dedicated pad is required for stress testing. This approach also increases the cost of the wafer test equipment, particularly the probe card used to contact the die during testing since an additional probe needle is needed for contacting the pad dedicated for application of the stress voltage, and also the overall test effort.

Thus, there is a need for an improved stress testing approach for driver devices that include nMOS power transistors.

SUMMARY

According to an embodiment of a driver device, the driver device comprises: a voltage terminal; a ground terminal; an output terminal; a first nMOS power transistor having a drain electrically connected to the voltage terminal, a source electrically connected to the output terminal, and a gate; an overvoltage protection circuit configured to limit a gate-to-source voltage of the first nMOS power transistor in a normal operating mode for the driver device; a pulldown circuit configured to force the first nMOS power transistor off in a stress test mode for the driver device; and a blocking circuit configured to block current flow from the output terminal to the ground terminal through the overvoltage protection circuit and the pulldown circuit in the stress test mode.

According to an embodiment of a method of stress testing a driver device that includes a first nMOS power transistor having a drain electrically connected to a voltage terminal, a source electrically connected to an output terminal, and a gate, the method comprises: configuring the driver device in a stress test mode, wherein in the stress test mode a pulldown circuit of the driver device electrically connects the gate of the first nMOS power transistor to the ground terminal, an overvoltage protection circuit of the driver device is deactivated so as to not limit the gate-to-source voltage of the first nMOS power transistor, and a blocking circuit of the driver device blocks current flow from the output terminal to the ground terminal through the overvoltage protection circuit and the pulldown circuit; in the stress test mode, applying a positive stress voltage to the output terminal that exceeds a maximum rated gate-to-source voltage for the first nMOS power transistor; and determining whether the first nMOS power transistor has a latent defect that was activated by the positive stress voltage.

According to another embodiment of a driver device, the driver device comprises: a voltage terminal; a ground terminal; an output terminal; a first nMOS power transistor having a drain electrically connected to the voltage terminal, a source electrically connected to the output terminal, and a gate; a first nMOS transistor having a first body diode; a second nMOS transistor having a drain electrically connected to the gate of the first nMOS power transistor and a source electrically connected to the ground terminal; a pMOS transistor having a second body diode; a third nMOS transistor having a drain electrically connected to a gate of the pMOS transistor and a source electrically connected to the ground terminal; and a resistor electrically connected between the gate of the pMOS transistor and a source of the pMOS transistor, wherein a source of the first nMOS transistor and an anode of the first body diode are electrically connected to the output terminal, wherein a drain of the pMOS transistor and an anode of the second body diode are electrically connected to the gate of the first nMOS power transistor, wherein a source of the pMOS transistor and a cathode of the second body diode are electrically connected to a drain of the first nMOS transistor and a cathode of the first body diode such that the second body diode and the first body diode are connected anti-serially.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a stress testing approach for a driver device that includes an nMOS power transistor. The stress testing approach allows for applying a negative gate-to-source stress voltage to the nMOS power transistor without requiring a dedicated pad on the driver device or an additional prober needle on the test equipment for applying the stress voltage. The negative gate-to-source stress voltage is applied by internally shorting the gate of the nMOS power transistor to ground via a ground terminal of the driver device, and externally forcing the output terminal of the driver device to a positive voltage that exceeds the maximum rated gate-to-source voltage for the nMOS power transistor. Current flow from the output terminal to the ground terminal is blocked during the stress testing by a blocking circuit. During or after stress testing, characterization or other type of analysis may be performed to determine whether the nMOS power transistor had a latent defect that was activated by the positive stress voltage.

Described next, with reference to the figures, are exemplary embodiments of a driver device configured to implement the stress testing approach and a method of stress testing the driver device.

Figure 1:
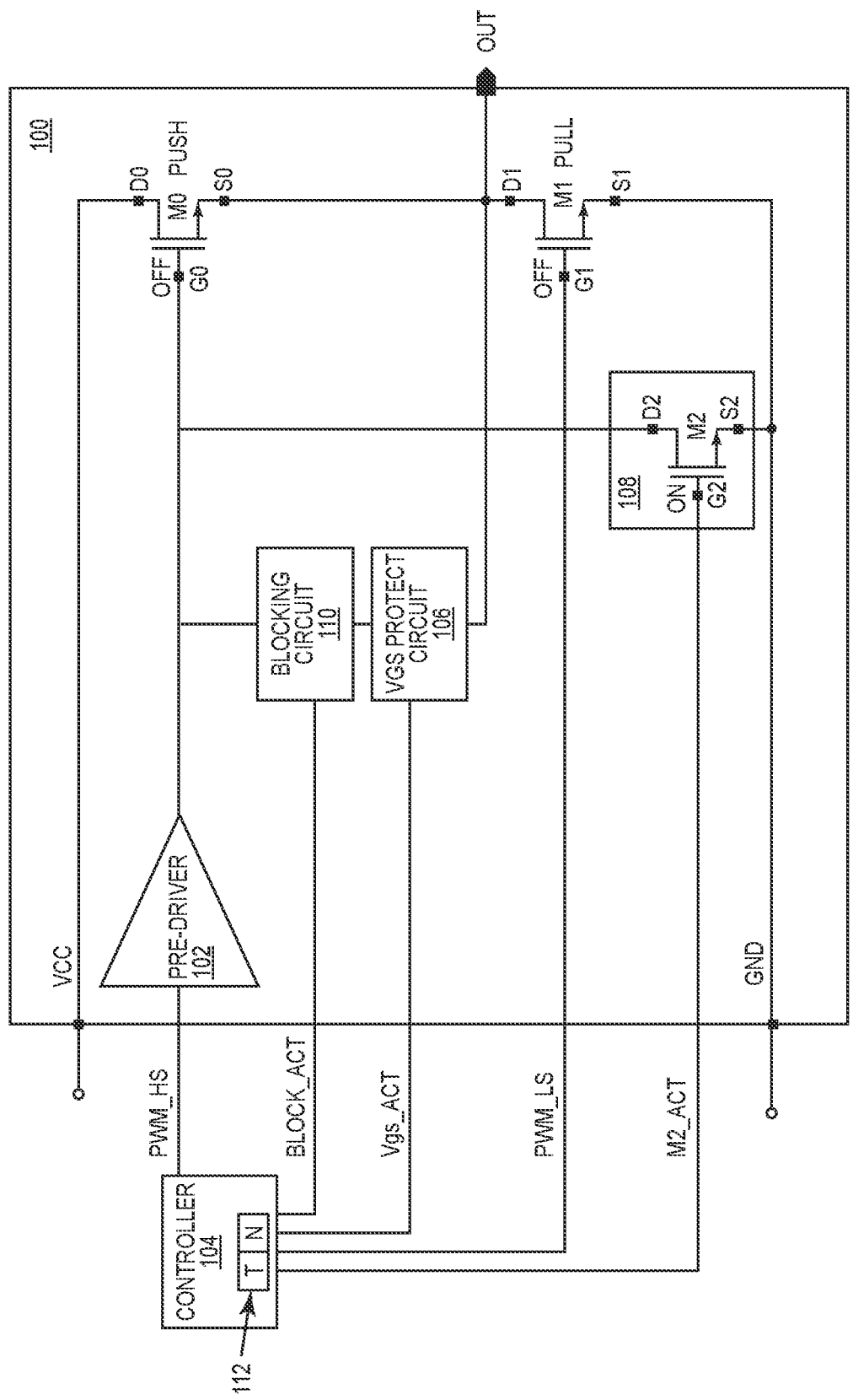
FIG. 1 illustrates a schematic of an embodiment of a driver device that includes an nMOS power transistor and a blocking circuit for enabling stress testing of the nMOS power transistor.

FIG. 1 illustrates an embodiment of a driver device 100 that includes a high-side ('Push') nMOS power transistor M0. The high-side nMOS power transistor M0 has a drain 'D0' electrically connected to a voltage terminal 'VCC' of the driver device 100, a source 'S0' electrically connected to an output terminal 'OUT' of the driver device 100, and a gate 'G0'. An external voltage is applied to the driver device 100 at the voltage terminal VCC and a load or other type of electrical device that sources or sinks a large current may be connected to the driver device 100 at the output terminal OUT.

The drain D0 and the source S0 of the high-side nMOS power transistor M0 are n-type semiconductor regions and the channel of the high-side nMOS power transistor M0 is formed by an inversion region of electrons that arises in a p-type body region along the gate 'G0' in response to a positive gate-to-source voltage being applied to the high-side nMOS power transistor M0. In one embodiment, the high-side nMOS power transistor M0 is an n-channel power MOSFET (metal-oxide-semiconductor field effect transistor). In another embodiment, the high-side nMOS power transistor M0 is an n-channel SiC power transistor.

Depending on the application, the driver device 100 may also include a low-side ('Pull') nMOS power transistor M1, e.g., in the case of a half bridge configuration. The low-side nMOS power transistor M1 has a drain 'D1' electrically connected to the output terminal OUT of the driver device 100, a source 'S1' electrically connected to a ground terminal 'GND' of the driver device 100, and a gate 'G1'. The high-side nMOS power transistor M0 sources current from the voltage terminal VCC to the output terminal OUT of the driver device 100 when the high-side nMOS power transistor M0 is on and the low-side nMOS power transistor M1 is off. The low-side nMOS power transistor M1 sinks current from the output terminal OUT to the ground terminal GND of the driver device 100 when the low-side nMOS power transistor M1 is on and the high-side nMOS power transistor M0 is off. The low-side nMOS power transistor M1 instead may be omitted from the driver device 100, e.g., in the case of a buck converter configuration, boost converter configuration, buck-boost converter configuration, etc.

The driver device 100 may include a pre-driver 102 for driving the gate G0 of the high-side nMOS power transistor M0. The pre-driver 102 conditions a logic-level gate drive signal such as a PWM (pulse width modulation) signal 'PWM_HS' from a controller 104 to a suitable voltage and current level for driving the gate G0 of the high-side nMOS power transistor M0. A corresponding gate drive signal 'PWM_LS' provided by the controller 104 for the optional low-side nMOS power transistor M1 may be suitable for driving the gate G1 of the low-side nMOS power transistor M1, or the driver device 100 may include additional pre-driver circuitry (not shown) for conditioning PWM_LS from the controller 104 to a suitable voltage and current level for driving the gate G1 of the low-side nMOS power transistor M1.

The pre-driver 102 and the high-side nMOS power transistor M0 may be integrated in the same semiconductor die or may be formed in separate semiconductor dies that are integrated in the same package or module. The controller 104 may be integrated in the same semiconductor die, package or module as the pre-driver 102 and high-side nMOS power transistor M0 or instead may be attached to a separate component of a larger power electronic assembly, e.g., such as to a PCB (printed circuit board). In each case, the voltage terminal VCC, output terminal OUT and ground terminal GND of the driver device 100 provide respective points of external electrical connection to the driver device 100.

The driver device 100 also includes an overvoltage protection circuit 106. The overvoltage protection circuit 106 limits the gate-to-source voltage of the high-side nMOS power transistor M0 in a normal operating mode for the driver device 100, to protect the high-side nMOS power transistor M0 from voltage spikes at switch on/off. If the driver device 100 includes the low-side nMOS power transistor M1, the pre-driver 102 may also discharge the gate G0 of the high-side nMOS power transistor M0 in the normal operating mode before the low-side nMOS power transistor M1 is activated and pulls down the output terminal OUT.

The state of the overvoltage protection circuit 106 may be controlled by a signal 'Vgs_ACT' provided by the controller 104. For example, the controller 104 may activate (turn-on overvoltage protection) or deactivate (turn-off overvoltage protection) the overvoltage protection circuit 106 based on the state of the control signal Vgs_ACT provided to the overvoltage protection circuit 106.

The driver device 100 also includes a pulldown circuit 108. The pulldown circuit 108 forces the high-side nMOS power transistor M0 off in a stress test mode for the driver device 100. In one embodiment, the pulldown circuit 108 comprises nMOS transistor M2 having a drain 'D2' electrically connected to the gate G0 of the high-side nMOS power transistor M0 and a source 'S2' electrically connected to the ground terminal GND of the driver device 100. The state of the pulldown circuit 108 may be controlled by a signal 'M2_ACT' provided by the controller 104. For example, the controller 104 may activate (turn-on pulldown function) or deactivate (turn-off pulldown function) the pulldown circuit 108 based on the state of the control signal M2_ACT provided to the gate 'G2' of nMOS transistor M2. When nMOS transistor M2 is on, the gate G0 of the high-side nMOS power transistor M0 is electrically connected to the ground terminal GND of the driver device 100 through nMOS transistor M2. The controller 104 turns on nMOS transistor M2 in the stress test mode and turns off nMOS transistor M2 in the normal operating mode.

In the normal operating mode, the high-side nMOS power transistor M0 is operated within its rated gate-to-source voltage range. That is, in the normal operating mode, the gate-to-source voltage of the high-side nMOS power transistor M0 does not exceed its maximum rated gate-to-source voltage. The driver device 100, via the high-side nMOS power transistor M0 and optional low-side nMOS power transistor M1, source or sink current to a load such as a multi-phase motor, convert AC to DC, invert DC to AC, etc. in the normal operating mode.

In the stress test mode, a negative gate-to-source stress voltage is applied to the gate G0 of the high-side nMOS power transistor M0. The negative gate-to-source stress voltage exceeds the maximum rated gate-to-source voltage for the high-side nMOS power transistor M0. For example, the negative gate-to-source stress voltage may be at least twice the maximum rated gate-to-source voltage for the high-side nMOS power transistor M0. The negative gate-to-source stress voltage is applied for a short duration of time to ensure that an otherwise defect-free power transistor is not damaged by the stress test but also to ensure that any latent defects, if present, are activated. Details of the stress test mode are explained in more detail later herein.

The driver device 100 also includes a blocking circuit 110. The blocking circuit 110 blocks current flow from the output terminal OUT to the ground terminal GND through the overvoltage protection circuit 106 and the pulldown circuit 108 in the stress test mode. The state of the blocking circuit 110 may be controlled by a signal 'Block_ACT' provided by the controller 104. For example, the controller 104 may activate (turn-on blocking function) or deactivate (turn-off blocking function) the blocking circuit 110 based on the state of the control signal Block_ACT provided to the blocking circuit 110. The controller 104 activates the blocking circuit 110 in the stress test mode and deactivates the blocking circuit 110 in the normal operating mode, via the control signal Block_ACT.

The state of high-side nMOS power transistor M0, low-side nMOS power transistor M1 and nMOS transistor M2 are indicated in FIG. 1 for the stress test mode. In the stress test mode, high-side nMOS power transistor M0 and low-side nMOS power transistor M1 are turned off as indicated by the 'OFF' gate status, respectively, and nMOS transistor M2 is turned on as indicated by the 'ON' gate status. With this transistor configuration, nMOS transistor M2 pulls the gate G0 of the high-side nMOS power transistor M0 to ground. If a positive stress voltage is applied to the output terminal OUT of the driver device 100, a negative gate-to-source stress voltage is applied to the high-side nMOS power transistor M0 without requiring a dedicated pad on the driver device 100 or an additional prober needle on the test equipment that applies the stress voltage.

The positive stress voltage exceeds the maximum rated gate-to-source voltage for the high-side nMOS power transistor M0, to activate one or more latent defects which may be present in the high-side nMOS power transistor M0. The overvoltage protection circuit 106 is deactivated in the stress test mode so as to not limit the gate-to-source voltage of the high-side nMOS power transistor M0. Current flow from the output terminal OUT to the ground terminal GND through the overvoltage protection circuit 106 (e.g., through a body diode) and the pulldown circuit 108 is blocked by the blocking circuit 110 in the stress test mode to aid the stress testing procedure. Otherwise, current flow through the overvoltage protection circuit 106 and the pulldown circuit 108 in the stress test mode may hinder readout accuracy during testing.

The controller 104 may include a register 112 for storing configuration information for both the normal operating mode ('N') and the stress test mode ('S'). According to this embodiment, the controller 104 determines the state of each of the high-side nMOS power transistor M0, the overvoltage protection circuit 106, the pulldown circuit 108 and the blocking circuit 110 during both the normal operating mode and the stress test mode, e.g., as described above, based on the configuration information N/S stored in the register 112.

Figure 2:
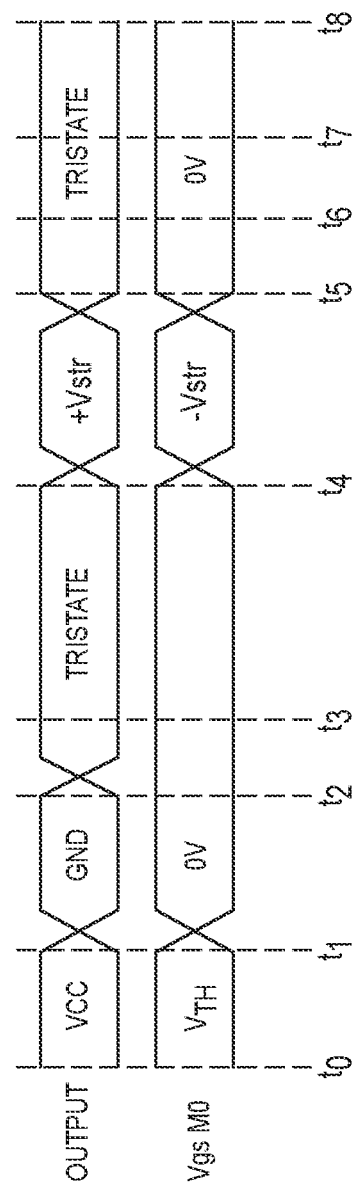
FIG. 2 illustrates a signal waveform diagram associated with the operation of the driver device in stress test mode.

FIG. 2 illustrates the state of the gate-to-source voltage ('Vgs M0') of the high-side nMOS power transistor M0 and the state of the output terminal OUT of the driver device 100 in the stress test mode.

Between time t0 and t1, the pre-driver 102 applies a positive gate voltage '$V_{TH}$' to the gate G0 of the high-side nMOS power transistor M0. The positive gate voltage $V_{TH}$ is sufficient to turn on the high-side nMOS power transistor M0 but is lower than the maximum rated gate-to-source voltage for the high-side nMOS power transistor M0. In response, the high-side nMOS power transistor M0 turns on and the output terminal OUT of the driver device 100 is electrically connected to the voltage terminal VCC of the driver device 100 through the high-side nMOS power transistor M0.

Between time t1 and t2, the pre-driver 102 applies zero gate voltage '0V' to the gate G0 of the high-side nMOS power transistor M0. In response, the high-side nMOS power transistor M0 turns off and the output terminal OUT of the driver device 100 may be electrically connected to the ground terminal GND through the low-side nMOS power transistor M1.

Between time t2 and t4, the pre-driver 102 applies zero gate voltage to both the gate G0 of the high-side nMOS power transistor M0 and the gate G1 of the low-side nMOS power transistor M1. In response, both the high-side nMOS power transistor M1 and the low-side nMOS power transistor M1 are off and the output terminal OUT of the driver device 100 enters a high impedance state 'TRISTATE'. A leakage current measurement or other type of measurement or characterization may be taken or performed between time t2 and t4, e.g., at time t3, to provide a pre-stress baseline point of reference.

Between time t4 and t5, a positive stress voltage '+Vstr' is applied to the output terminal OUT of the driver device 100. The positive stress voltage +Vstr exceeds the maximum rated gate-to-source voltage for the high-side nMOS power transistor M0. As explained above, the gate G0 of the high-side nMOS power transistor M0 is electrically connected to the ground terminal GND of the driver device 100 through the pulldown circuit 108 in the stress test mode. Accordingly, a negative gate-to-source stress voltage '−Vstr' is applied to the gate G0 of the high-side nMOS power transistor M0 in the stress test mode.

The negative gate-to-source stress voltage exceeds the maximum rated gate-to-source voltage for the high-side nMOS power transistor M0. For example, the maximum rated positive gate-to-source voltage for the high-side nMOS power transistor M0 may be in a range of 2.5 to 2.75V and the maximum rated negative gate-to-source voltage for the high-side nMOS power transistor M0 may be in a range of −2.5 to −2.75V. In this example, the positive stress voltage +Vstr applied to the output terminal OUT of the driver device 100 in the stress test mode may be +5V, +5.2V or more positive and the corresponding negative gate-to-source stress voltage −Vstr applied to the gate G0 of the high-side nMOS power transistor M0 in the stress test mode may be −5V, −5.2V or more negative. More generally, the positive stress voltage +Vstr applied to the output terminal OUT in the stress test mode may be at least twice the maximum rated gate-to-source voltage for the high-side nMOS power transistor M0.

Between time t5 and t8, the pre-driver 102 applies zero gate voltage to both the gate G0 of the high-side nMOS power transistor M0 and the gate G1 of the low-side nMOS power transistor M1. In response, both the high-side nMOS power transistor M1 and the low-side nMOS power transistor M1 are off and the output terminal OUT of the driver device 100 enters a high impedance state 'TRISTATE'.

A leakage current measurement or other type of measurement or characterization may be taken or performed between time t5 and t8, e.g., at time t6, t7, etc. to provide a point of comparison with the pre-stress baseline point of reference taken before application of the positive stress voltage +Vstr. For example, a first leakage measurement may be taken at the output terminal OUT at time t3 while both the high-side nMOS power transistor M0 and the low-side nMOS power transistor M1 are off and before application of the positive stress voltage +Vstr. A second leakage measurement may be taken at the output terminal OUT while the positive stress voltage +Vstr is applied to the output terminal OUT or afterword, e.g., at t6, t7, etc. while both the high-side nMOS power transistor and the low-side nMOS power transistor are off. The first leakage measurement and the second leakage measurement may be compared to determine whether the high-side nMOS power transistor M0 had a latent defect that was activated by the positive stress voltage +Vstr, e.g., if the second leakage measurement exceeds the first leakage measurement by a predetermined percentage or magnitude.

In another embodiment, a measurement is taken and/or characterization performed during or after application of the positive stress voltage +Vstr but not before application of the positive stress voltage +Vstr. In this case, the measurement and/or characterization is compared to a threshold to determine whether the high-side nMOS power transistor M0 had a latent defect that was activated by the positive stress voltage +Vstr. For example, a leakage measurement may be taken at the output terminal OUT of the driver device 100 while the positive stress voltage +Vstr is applied to the output terminal OUT or after applying the positive stress voltage +Vstr. The post-stress leakage measurement is compared to a threshold value to determine whether the high-side nMOS power transistor M0 had a latent defect that was activated by the positive stress voltage +Vstr.

In another embodiment, one or more signatures of the high-side nMOS power transistor M0 may be characterized while applying the positive stress voltage +Vstr to the output terminal OUT of the driver device 100 to determine whether the high-side nMOS power transistor M0 had a latent defect that was activated by the positive stress voltage +Vstr. For example, the high-side nMOS power transistor M0 may exhibit a particular heat signature, infrared signature, etc. if a latent defect is activated by the positive stress voltage +Vstr. The high-side nMOS power transistor M0 may be monitored for such a signature while the positive stress voltage +Vstr is applied to the output terminal OUT, to determine whether the high-side nMOS power transistor M0 had a latent defect that was activated by the positive stress voltage +Vstr.

Figure 3:
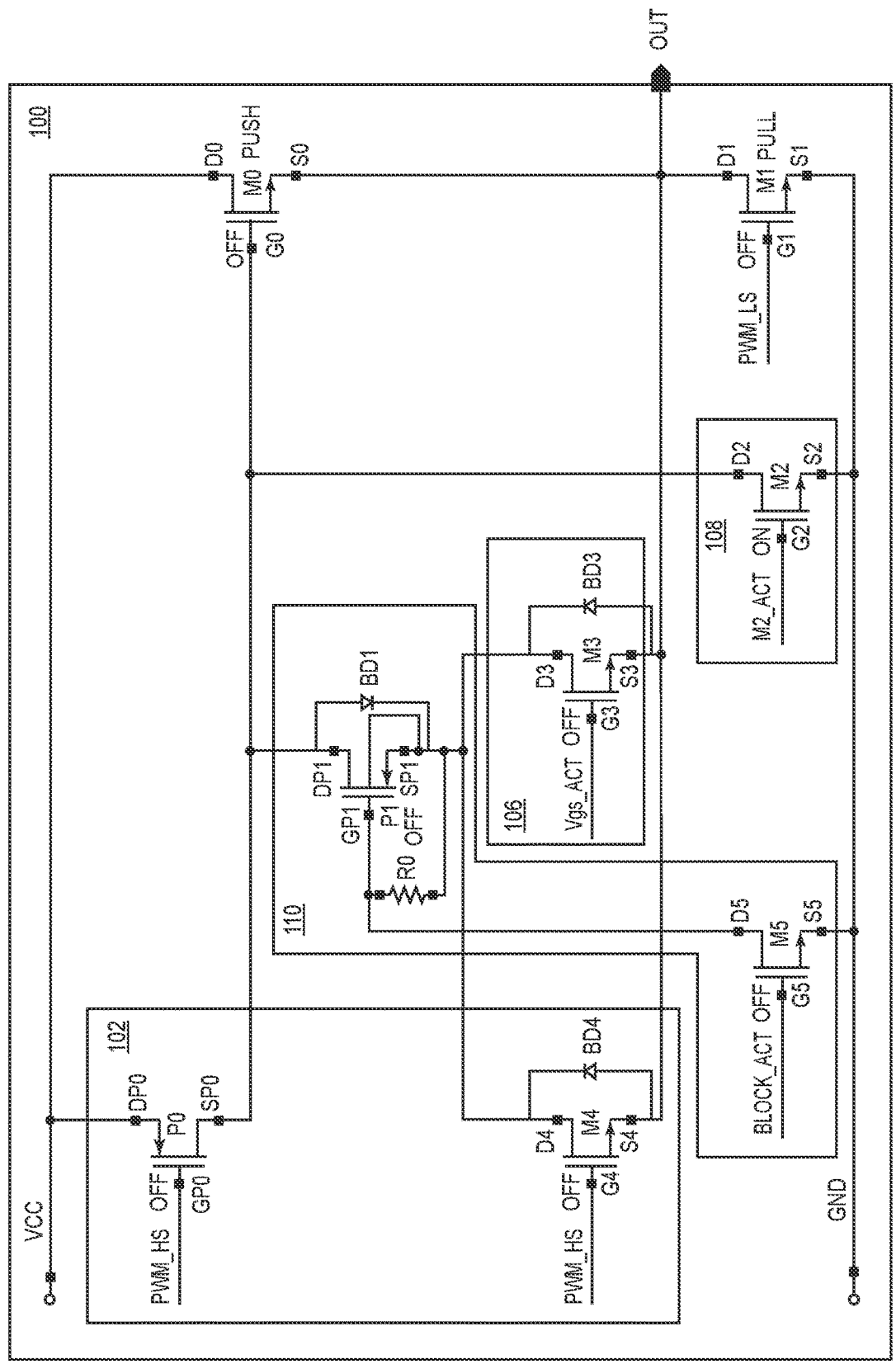
FIG. 3 illustrates a schematic of another embodiment of a driver device that includes an nMOS power transistor and a blocking circuit for enabling stress testing of the nMOS power transistor.

FIG. 3 illustrates an embodiment of the overvoltage protection circuit 106 and the blocking circuit 110 of the driver device 100. The controller 104 is not shown in FIG. 3 to emphasize details of the overvoltage protection circuit 106 and the blocking circuit 110. As in FIG. 1, the on/off state of each transistor included in the driver device 100 is indicated in FIG. 3 during the stress test mode.

According to the embodiment illustrated in FIG. 3, the overvoltage protection circuit 106 includes nMOS transistor M3 having a body diode BD3. The drain 'D3' of nMOS transistor M3 and the cathode of its body diode BD3 are electrically connected to the gate G0 of the high-side nMOS power transistor M0 through the blocking circuit 110. The source 'S3' of nMOS transistor M3 and the anode of its body diode BD3 are electrically connected to the output terminal OUT of the driver device 100. When the output terminal OUT and therefore the source S3 of nMOS transistor M3 are at the positive stress voltage +Vstr in the stress test mode, the body diode BD3 of nMOS transistor M3 becomes forward biased. Negative current will flow through the body diode BD3 to the ground terminal GND through the pulldown circuit 108 unless blocked, inhibiting readout capability in the stress test mode.

The blocking circuit 110 is configured to block current flow from the body diode BD3 of nMOS transistor M3 of the overvoltage protection circuit 106 to the pulldown circuit 108 in the stress test mode. According to the embodiment illustrated in FIG. 3, the blocking circuit 110 includes pMOS transistor P1 having a body diode BD1. The drain 'DP1' of pMOS transistor P1 and the anode of its body diode BD1 are electrically connected to the gate G0 of the high-side nMOS power transistor M0. The source 'SP1' of pMOS transistor P1 and the cathode of its body diode BD1 are electrically connected to the drain D3 of nMOS transistor M3 and the cathode of body diode BD3 of nMOS transistor M3, such that the body diode BD1 of pMOS transistor P1 and the body diode BD3 of nMOS transistor M3 are connected anti-serially. That is, the body diode BD1 of pMOS transistor P1 and the body diode BD3 of nMOS transistor M3 are connected in series but with their polarities reversed. The pMOS transistor P1 of the blocking circuit 110 is configured to be on in the normal operating mode and off in the stress test mode, and the body diode BD1 of pMOS transistor P1 is configured to block current flow from the body diode BD3 of nMOS transistor M3 to the pulldown circuit 108 in the stress test mode.

To aid in the biasing of the pMOS transistor P1 of the blocking circuit 110 in both the normal operating mode and the stress test mode, the blocking circuit 110 may further include an additional nMOS transistor M5 configured to electrically connect the gate 'GP1' of pMOS transistor P1 to the ground terminal GND of the driver device 100 in the normal operating mode. That is, nMOS transistor M5, which may be controlled by signal Block_ACT provided by the controller 104, is on in the normal operating mode and therefore pulls the GP1 of pMOS transistor P1 to the ground terminal GND in the normal operating mode. Signal Block_ACT deactivates nMOS transistor M5 in the stress test mode, such that nMOS transistor M5 is off in the stress test mode.

The blocking circuit 110 may also include a resistor R0 electrically connected between the gate GP1 and source SP1 of pMOS transistor P1. As previously explained herein, the pulldown circuit 108 may include nMOS transistor M2 having a drain D2 electrically connected to the gate G0 of the high-side nMOS power transistor G0 and a source S2 electrically connected to the ground terminal GND. In the stress test mode, nMOS transistor M2 of the pulldown circuit 108 electrically connects the gate G0 of the high-side nMOS power transistor G0 to the ground terminal GND. The body diode BD1 of pMOS transistor P1 of the blocking circuit 110 blocks current flow from the body diode BD3 of nMOS transistor M3 of the overvoltage protection circuit 106 to the nMOS transistor M2 of the pulldown circuit 108 in the stress test mode.

In the normal operating mode, nMOS transistor M5 of the blocking circuit 110 is on and a sink ground current flowing through resistor R0 and nMOS transistor M5 to the ground terminal of the driver device 100 turns on pMOS transistor P1 of the blocking circuit 110. With pMOS transistor P1 on in the normal operating mode, the overvoltage protection circuit 106 can prevent voltage excursions at the gate G0 of the high-side nMOS power transistor M0. In the stress test mode, nMOS transistor M5 of the blocking circuit 110 is off and resistor RO biases the gate GP1 of pMOS transistor P1 such that pMOS transistor P1 is off and the body diode BD1 of pMOS transistor P1 blocks current flow from the body diode BD3 of nMOS transistor M3 to nMOS transistor M2 and ground.

The pre-driver 102 may include nMOS transistor M4 having a body diode BD4. The source 'S4' of nMOS transistor M4 and the anode of its body diode BD4 are electrically connected to the source S3 of nMOS transistor M3 and the anode of the body diode BD3 of nMOS M3. The drain 'D4' of nMOS transistor M4 and the cathode of its body diode BD4 are electrically connected to the source SP1 of pMOS transistor P1 and the cathode of the body diode BD1 of pMOS transistor P1 such that the body diode BD4 of nMOS transistor M4 and the body diode BD1 of pMOS transistor P1 are connected anti-serially. The nMOS transistor M4 and corresponding body diode BD4 of the pre-driver 102 discharge the gate G0 of the high-side nMOS power transistor M0 in the normal operating mode before the low-side nMOS power transistor M1 is activated and pulls down the output terminal OUT. The nMOS transistor M4 of the pre-driver 102 is off in the stress test mode.

Figure 4:
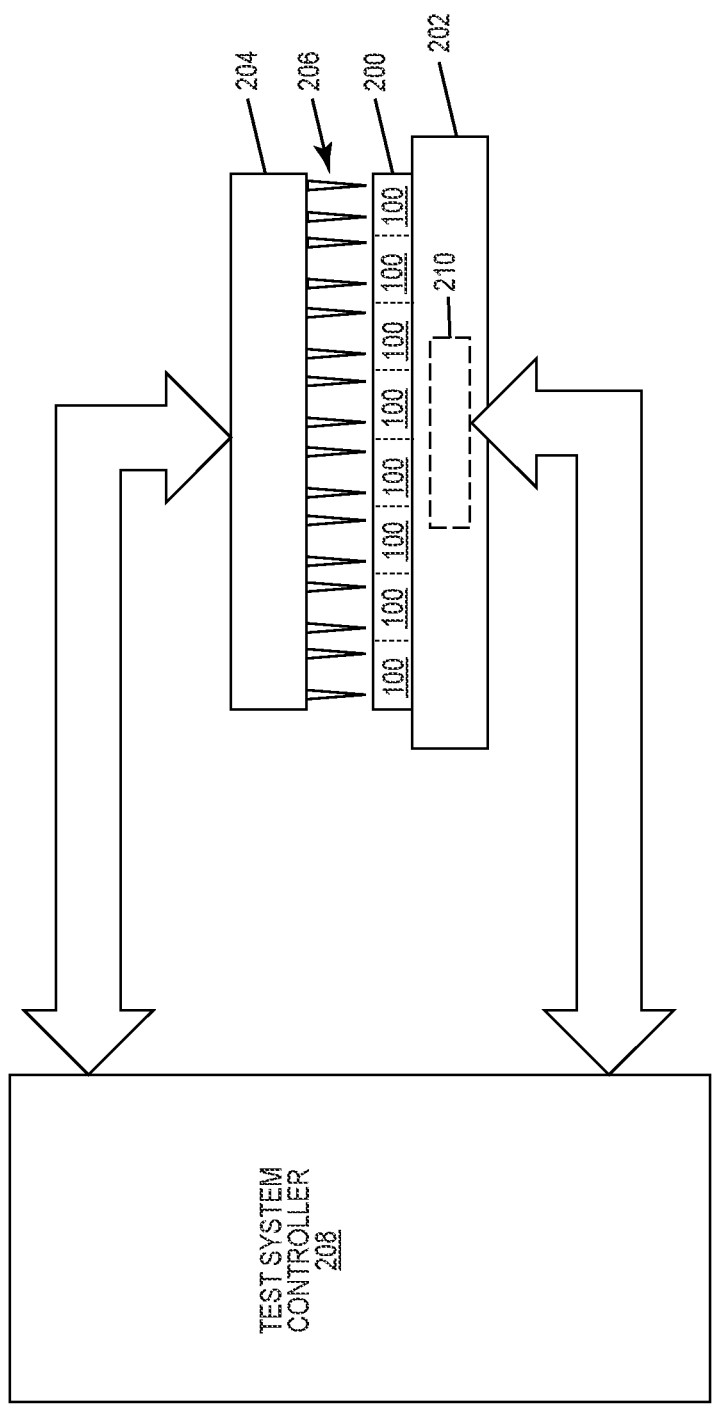
FIG. 4 illustrates a block diagram of an embodiment of a test system for stress testing a semiconductor wafer that includes driver devices each having an nMOS power transistor and a blocking circuit for enabling stress testing of the nMOS power transistor.

FIG. 4 illustrates an embodiment of a test system for stress testing a semiconductor wafer 200 that includes a plurality of the driver devices 100 previously described herein. In this case, the driver devices 100 have yet to be singulated (i.e., physically separated from one another by dicing, cutting, etc.).

The test system includes a platform 202 for receiving the semiconductor wafer 200 and a prober interface 204 with needles 206 for probing/contacting pads of each driver device included in the semiconductor wafer 200. The prober interface 204 is illustrated with minimal detail but includes the hardware needed to interface with the semiconductor wafer 200 during stress testing.

The test system also includes a test system controller 208 which includes the analog and/or digital logic, software and hardware used to implement stress testing of the semiconductor wafer 200 and for measuring and analysing the test results. The test system controller 208 is programmed to execute the stress test mode described herein. Accordingly, the test system controller 208 configures each driver device 100 in the stress test mode, e.g., by mimicking the corresponding controller functions previously described herein. As a result, in the stress test mode, the pulldown circuit 110 of each driver device 100 electrically connects the gate G0 of the corresponding high-side nMOS power transistor M0 to the ground terminal GND of the driver device 100, the overvoltage protection circuit 106 of each driver device 100 is deactivated so as to not limit the gate-to-source voltage of the high-side nMOS power transistor M0, and the blocking circuit 110 of each driver device 100 is configured to block current flow from the output terminal OUT to the ground terminal GND of the driver device 100 through the overvoltage protection circuit 106 and the pulldown circuit 108 of the driver device 100.

In the stress test mode, the test system controller 208 applies, via the prober interface 204, a positive stress voltage to the output terminal OUT of each driver device 100. The positive stress voltage exceeds the maximum rated gate-to-source voltage for the high-side nMOS power transistor M0 included in each driver device 100. The test system controller 208 also determines whether each high-side nMOS power transistor M0 had a latent defect that was activated by the positive stress voltage. This may involve taking a first leakage measurement at the output terminal OUT of each driver device 100 before applying the positive stress voltage, applying the positive stress voltage to the output terminal OUT of each driver device 100 after taking the first leakage measurement, taking a second leakage measurement at the output terminal OUT of each driver device 100 while the positive stress voltage is applied to the output terminal OUT or after applying the positive stress voltage, and comparing the first leakage measurement and the second leakage measurement to determine whether any latent defects have been activated.

Instead of comparing pre and post stress voltage leakage measurements to determine whether any latent defects have been activated, the test system controller 208 instead may determine whether any latent defects have been activated by taking a single leakage measurement at the output terminal OUT of each driver device 100 while the positive stress voltage is applied to the output terminal OUT or after applying the positive stress voltage and comparing the single leakage measurement to a threshold value.

Separately or in combination with either of the leakage current measurement approaches, the test system controller 208 may determine whether any latent defects have been activated by characterizing one or more signatures of the high-side nMOS power transistor M0 of each driver device 100 during application of the positive stress voltage. For example, the high-side nMOS power transistor M0 included in a driver device 100 may exhibit a particular heat signature, infrared signature, etc. if a latent defect is activated by the positive stress voltage. The test system may include a sensor 210 such as a heat sensor, infrared sensor, etc. for monitoring each high-side nMOS power transistor M0 for such a signature while the positive stress voltage is applied to the output terminal OUT of each driver device 100. The test system controller 208 may analyze the output of the sensor 210 to determine whether any of the high-side nMOS power transistors M0 had a latent defect that was activated during application of the positive stress voltage.

Although the present disclosure is not so limited, the following numbered examples demonstrate one or more aspects of the disclosure.

Example 1. A driver device, comprising: a voltage terminal; a ground terminal; an output terminal; a first nMOS power transistor having a drain electrically connected to the voltage terminal, a source electrically connected to the output terminal, and a gate; an overvoltage protection circuit configured to limit a gate-to-source voltage of the first nMOS power transistor in a normal operating mode for the driver device; a pulldown circuit configured to force the first nMOS power transistor off in a stress test mode for the driver device; and a blocking circuit configured to block current flow from the output terminal to the ground terminal through the overvoltage protection circuit and the pulldown circuit in the stress test mode.

Example 2. The driver device of example 1, wherein the pulldown circuit comprises an nMOS transistor having a drain electrically connected to the gate of the first nMOS power transistor and a source electrically connected to the ground terminal, wherein the nMOS transistor is configured to electrically connect the gate of the first nMOS power transistor to the ground terminal in the stress test mode, and wherein the blocking circuit is configured to block current flow from the overvoltage protection circuit to the nMOS transistor in the stress test mode.

Example 3. The driver device of example 1 or 2, wherein the overvoltage protection circuit comprises a first nMOS transistor having a first body diode, wherein a drain of the first nMOS transistor and a cathode of the first body diode are electrically connected to the gate of the first nMOS power transistor through the blocking circuit, wherein a source of the first nMOS transistor and an anode of the first body diode are electrically connected to the output terminal, and wherein the blocking circuit is configured to block current flow from the first body diode to the pulldown circuit in the stress test mode.

Example 4. The driver device of example 3, wherein the blocking circuit comprises a pMOS transistor having a second body diode, wherein a drain of the pMOS transistor and an anode of the second body diode are electrically connected to the gate of the first nMOS power transistor, wherein a source of the pMOS transistor and a cathode of the second body diode are electrically connected to the drain of the first nMOS transistor and the cathode of the first body diode such that the second body diode and the first body diode are connected anti-serially, wherein the pMOS transistor is configured to be on in the normal operating mode and off in the stress test mode, and wherein the second body diode is configured to block current flow from the first body diode to the pulldown circuit in the stress test mode.

Example 5. The driver device of example 4, wherein the blocking circuit further comprises a second nMOS transistor configured to electrically connect a gate of the pMOS transistor to the ground terminal in the normal operating mode.

Example 6. The driver device of example 4 or 5, wherein the blocking circuit further comprises a resistor electrically connected between a gate of the pMOS transistor and the source of the pMOS transistor.

Example 7. The driver device of example 4, wherein the blocking circuit further comprises: a second nMOS transistor having a drain electrically connected to a gate of the pMOS transistor and a source electrically connected to the ground terminal; and a resistor electrically connected between the gate of the pMOS transistor and the source of the pMOS transistor.

Example 8. The driver device of example 7, wherein the pulldown circuit comprises a third nMOS transistor having a drain electrically connected to the gate of the first nMOS power transistor and a source electrically connected to the ground terminal, wherein the third nMOS transistor is configured to electrically connect the gate of the first nMOS power transistor to the ground terminal in the stress test mode, and wherein the second body diode is configured to block current flow from the first body diode to the third nMOS transistor in the stress test mode.

Example 9. The driver device of example 7 or 8, wherein in the normal operating mode, the second nMOS transistor is on and a sink ground current flowing through the resistor and the second nMOS transistor to the ground terminal turns on the pMOS transistor, and wherein in the stress test mode, the second nMOS transistor is off and the resistor biases the gate of the pMOS transistor such that the pMOS transistor is off.

Example 10. The driver device of any of examples 4 through 9, further comprising a second nMOS transistor having a third body diode, wherein a source of the second nMOS transistor and an anode of the third body diode are electrically connected to the source of the first nMOS transistor and the anode of the first body diode, and wherein a drain of the second nMOS transistor and a cathode of the third body diode are electrically connected to the source of the pMOS transistor and the cathode of the second body diode such that the third body diode and the first body diode are connected anti-serially.

Example 11. The driver device of any of examples 1 through 10, further comprising: a second nMOS power transistor having a drain electrically connected to the output terminal, a source electrically connected to the ground terminal, and a gate.

Example 12. The driver device of any of examples 1 through 11, further comprising: a controller having a register configured to store configuration information for both the normal operating mode and the stress test mode, wherein the configuration information determines a state of each of the first nMOS power transistor, the overvoltage protection circuit, the pulldown circuit and the blocking circuit during both the normal operating mode and the stress test mode.

Example 13. A method of stress testing a driver device that includes a first nMOS power transistor having a drain electrically connected to a voltage terminal, a source electrically connected to an output terminal, and a gate, the method comprising: configuring the driver device in a stress test mode, wherein in the stress test mode a pulldown circuit of the driver device electrically connects the gate of the first nMOS power transistor to the ground terminal, an overvoltage protection circuit of the driver device is deactivated so as to not limit the gate-to-source voltage of the first nMOS power transistor, and a blocking circuit of the driver device blocks current flow from the output terminal to the ground terminal through the overvoltage protection circuit and the pulldown circuit; in the stress test mode, applying a positive stress voltage to the output terminal that exceeds a maximum rated gate-to-source voltage for the first nMOS power transistor; and determining whether the first nMOS power transistor has a latent defect that was activated by the positive stress voltage.

Example 14. The method of example 13, wherein determining whether the first nMOS power transistor has a latent defect that was activated by the positive stress voltage comprises: before applying the positive stress voltage, taking a first leakage measurement at the output terminal; after taking the first leakage measurement, applying the positive stress voltage to the output terminal; taking a second leakage measurement at the output terminal while the positive stress voltage is applied to the output terminal or after applying the positive stress voltage; and comparing the first leakage measurement and the second leakage measurement.

Example 15. The method of example 14, wherein the driver device further comprises a second nMOS power transistor having a drain electrically connected to the output terminal, a source electrically connected to the ground terminal, and a gate, wherein the first leakage measurement is taken at the output terminal while both the first nMOS power transistor and the second nMOS power transistor are off.

Example 16. The method of example 15, wherein the second leakage measurement is taken at the output terminal while both the first nMOS power transistor and the second nMOS power transistor are off.

Example 17. The method of any of examples 13 through 16, wherein the positive stress voltage applied to the output terminal in the stress test mode is at least twice the maximum rated gate-to-source voltage for the first nMOS power transistor.

Example 18. The method of any of examples 13 through 17, wherein determining whether the first nMOS power transistor has a latent defect that was activated by the positive stress voltage comprises: taking a leakage measurement at the output terminal while the positive stress voltage is applied to the output terminal or after applying the positive stress voltage; and comparing the leakage measurement to a threshold value.

Example 19. The method of any of examples 13 through 18, wherein determining whether the first nMOS power transistor has a latent defect that was activated by the positive stress voltage comprises: while applying the positive stress voltage to the output terminal, characterizing one or more signatures of the first nMOS power transistor.

Example 20. A driver device, comprising: a voltage terminal; a ground terminal; an output terminal; a first nMOS power transistor having a drain electrically connected to the voltage terminal, a source electrically connected to the output terminal, and a gate; a first nMOS transistor having a first body diode; a second nMOS transistor having a drain electrically connected to the gate of the first nMOS power transistor and a source electrically connected to the ground terminal; a pMOS transistor having a second body diode; a third nMOS transistor having a drain electrically connected to a gate of the pMOS transistor and a source electrically connected to the ground terminal; and a resistor electrically connected between the gate of the pMOS transistor and a source of the pMOS transistor, wherein a source of the first nMOS transistor and an anode of the first body diode are electrically connected to the output terminal, wherein a drain of the pMOS transistor and an anode of the second body diode are electrically connected to the gate of the first nMOS power transistor, wherein a source of the pMOS transistor and a cathode of the second body diode are electrically connected to a drain of the first nMOS transistor and a cathode of the first body diode such that the second body diode and the first body diode are connected anti-serially.

Example 21. The driver device of example 20, further comprising: a fourth nMOS transistor having a third body diode, wherein a source of the fourth nMOS transistor and an anode of the third body diode are electrically connected to the source of the first nMOS transistor and the anode of the first body diode, wherein a drain of the fourth nMOS transistor and a cathode of the third body diode are electrically connected to the source of the pMOS transistor and the cathode of the second body diode such that the third body diode and the first body diode are connected anti-serially.

Example 22. The driver device of example 20 or 21, further comprising: a controller having a register configured to store configuration information for both the normal operating mode and the stress test mode, wherein the configuration information determines an on/off state of each of the first nMOS power transistor, the first nMOS transistor, the second nMOS transistor and the third nMOS transistor during both the normal operating mode and the stress test mode.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A driver device, comprising:
a voltage terminal;
a ground terminal;
an output terminal;
a first nMOS power transistor having a drain electrically connected to the voltage terminal, a source electrically connected to the output terminal, and a gate;
an overvoltage protection circuit configured to limit a gate-to-source voltage of the first nMOS power transistor in a normal operating mode for the driver device;
a pulldown circuit configured to force the first nMOS power transistor off in a stress test mode for the driver device; and
a blocking circuit configured to block current flow from the output terminal to the ground terminal through the overvoltage protection circuit and the pulldown circuit in the stress test mode.

2. The driver device of claim 1, wherein the pulldown circuit comprises an nMOS transistor having a drain electrically connected to the gate of the first nMOS power transistor and a source electrically connected to the ground terminal, wherein the nMOS transistor is configured to electrically connect the gate of the first nMOS power transistor to the ground terminal in the stress test mode, and wherein the blocking circuit is configured to block current flow from the overvoltage protection circuit to the nMOS transistor in the stress test mode.

3. The driver device of claim 1, wherein the overvoltage protection circuit comprises a first nMOS transistor having a first body diode, wherein a drain of the first nMOS transistor and a cathode of the first body diode are electrically connected to the gate of the first nMOS power transistor through the blocking circuit, wherein a source of the first nMOS transistor and an anode of the first body diode are electrically connected to the output terminal, and wherein the blocking circuit is configured to block current flow from the first body diode to the pulldown circuit in the stress test mode.

4. The driver device of claim 3, wherein the blocking circuit comprises a pMOS transistor having a second body diode, wherein a drain of the pMOS transistor and an anode of the second body diode are electrically connected to the gate of the first nMOS power transistor, wherein a source of the pMOS transistor and a cathode of the second body diode are electrically connected to the drain of the first nMOS transistor and the cathode of the first body diode such that the second body diode and the first body diode are connected anti-serially, wherein the pMOS transistor is configured to be on in the normal operating mode and off in the stress test mode, and wherein the second body diode is configured to block current flow from the first body diode to the pulldown circuit in the stress test mode.

5. The driver device of claim 4, wherein the blocking circuit further comprises a second nMOS transistor configured to electrically connect a gate of the pMOS transistor to the ground terminal in the normal operating mode.

6. The driver device of claim 4, wherein the blocking circuit further comprises a resistor electrically connected between a gate of the pMOS transistor and the source of the pMOS transistor.

7. The driver device of claim 4, wherein the blocking circuit further comprises:
   a second nMOS transistor having a drain electrically connected to a gate of the pMOS transistor and a source electrically connected to the ground terminal; and
   a resistor electrically connected between the gate of the pMOS transistor and the source of the pMOS transistor.

8. The driver device of claim 7, wherein the pulldown circuit comprises a third nMOS transistor having a drain electrically connected to the gate of the first nMOS power transistor and a source electrically connected to the ground terminal, wherein the third nMOS transistor is configured to electrically connect the gate of the first nMOS power transistor to the ground terminal in the stress test mode, and wherein the second body diode is configured to block current flow from the first body diode to the third nMOS transistor in the stress test mode.

9. The driver device of claim 7, wherein in the normal operating mode, the second nMOS transistor is on and a sink ground current flowing through the resistor and the second nMOS transistor to the ground terminal turns on the pMOS transistor, and wherein in the stress test mode, the second nMOS transistor is off and the resistor biases the gate of the pMOS transistor such that the pMOS transistor is off.

10. The driver device of claim 4, further comprising a second nMOS transistor having a third body diode, wherein a source of the second nMOS transistor and an anode of the third body diode are electrically connected to the source of the first nMOS transistor and the anode of the first body diode, and wherein a drain of the second nMOS transistor and a cathode of the third body diode are electrically connected to the source of the pMOS transistor and the cathode of the second body diode such that the third body diode and the first body diode are connected anti-serially.

11. The driver device of claim 1, further comprising:
    a second nMOS power transistor having a drain electrically connected to the output terminal, a source electrically connected to the ground terminal, and a gate.

12. The driver device of claim 1, further comprising:
    a controller having a register configured to store configuration information for both the normal operating mode and the stress test mode,
    wherein the configuration information determines a state of each of the first nMOS power transistor, the overvoltage protection circuit, the pulldown circuit and the blocking circuit during both the normal operating mode and the stress test mode.

13. A method of stress testing a driver device that includes a first nMOS power transistor having a drain electrically connected to a voltage terminal, a source electrically connected to an output terminal, and a gate, the method comprising:
    configuring the driver device in a stress test mode, wherein in the stress test mode a pulldown circuit of the driver device electrically connects the gate of the first nMOS power transistor to the ground terminal, an overvoltage protection circuit of the driver device is deactivated so as to not limit the gate-to-source voltage of the first nMOS power transistor, and a blocking circuit of the driver device blocks current flow from the output terminal to the ground terminal through the overvoltage protection circuit and the pulldown circuit;
    in the stress test mode, applying a positive stress voltage to the output terminal that exceeds a maximum rated gate-to-source voltage for the first nMOS power transistor; and
    determining whether the first nMOS power transistor has a latent defect that was activated by the positive stress voltage.

14. The method of claim 13, wherein determining whether the first nMOS power transistor has a latent defect that was activated by the positive stress voltage comprises:
    before applying the positive stress voltage, taking a first leakage measurement at the output terminal;
    after taking the first leakage measurement, applying the positive stress voltage to the output terminal;
    taking a second leakage measurement at the output terminal while the positive stress voltage is applied to the output terminal or after applying the positive stress voltage; and
    comparing the first leakage measurement and the second leakage measurement.

15. The method of claim 14, wherein the driver device further comprises a second nMOS power transistor having a drain electrically connected to the output terminal, a source electrically connected to the ground terminal, and a gate, wherein the first leakage measurement is taken at the output terminal while both the first nMOS power transistor and the second nMOS power transistor are off.

16. The method of claim 15, wherein the second leakage measurement is taken at the output terminal while both the first nMOS power transistor and the second nMOS power transistor are off.

17. The method of claim 13, wherein the positive stress voltage applied to the output terminal in the stress test mode is at least twice the maximum rated gate-to-source voltage for the first nMOS power transistor.

18. The method of claim 13, wherein determining whether the first nMOS power transistor has a latent defect that was activated by the positive stress voltage comprises:
    taking a leakage measurement at the output terminal while the positive stress voltage is applied to the output terminal or after applying the positive stress voltage; and
    comparing the leakage measurement to a threshold value.

19. The method of claim 13, wherein determining whether the first nMOS power transistor has a latent defect that was activated by the positive stress voltage comprises:
    while applying the positive stress voltage to the output terminal, characterizing one or more signatures of the first nMOS power transistor.

20. A driver device, comprising:
    a voltage terminal;
    a ground terminal;
    an output terminal;
    a first nMOS power transistor having a drain electrically connected to the voltage terminal, a source electrically connected to the output terminal, and a gate;
    a first nMOS transistor having a first body diode;
    a second nMOS transistor having a drain electrically connected to the gate of the first nMOS power transistor and a source electrically connected to the ground terminal;
    a pMOS transistor having a second body diode;
    a third nMOS transistor having a drain electrically connected to a gate of the pMOS transistor and a source electrically connected to the ground terminal; and
    a resistor electrically connected between the gate of the pMOS transistor and a source of the pMOS transistor, wherein a source of the first nMOS transistor and an anode of the first body diode are electrically connected to the output terminal, wherein a drain of the pMOS transistor and an anode of the second body diode are electrically connected to the gate of the first nMOS power transistor, wherein a source of the pMOS transistor and a cathode of the second body diode are electrically connected to a drain of the first nMOS transistor and a cathode of the first body diode such that the second body diode and the first body diode are connected anti-serially.

21. The driver device of claim 20, further comprising:

a fourth nMOS transistor having a third body diode, wherein a source of the fourth nMOS transistor and an anode of the third body diode are electrically connected to the source of the first nMOS transistor and the anode of the first body diode, wherein a drain of the fourth nMOS transistor and a cathode of the third body diode are electrically connected to the source of the pMOS transistor and the cathode of the second body diode such that the third body diode and the first body diode are connected anti-serially.

22. The driver device of claim 20, further comprising:

a controller having a register configured to store configuration information for both the normal operating mode and the stress test mode, wherein the configuration information determines an on/off state of each of the first nMOS power transistor, the first nMOS transistor, the second nMOS transistor and the third nMOS transistor during both the normal operating mode and the stress test mode.

\* \* \* \* \*